United States Patent [19]

Thomas et al.

[11] Patent Number: 5,748,523

[45] Date of Patent: May 5, 1998

[54] INTEGRATED CIRCUIT MAGNETIC MEMORY ELEMENT HAVING A MAGNETIZABLE MEMBER AND AT LEAST TWO CONDUCTIVE WINDING

[75] Inventors: Michael E. Thomas, Milpitas; Irfan Saadat, Santa Clara, both of Calif.

[73] Assignee: National Semiconductor Corporation, Santa Clara, Calif.

[21] Appl. No.: 787,364

[22] Filed: Jan. 22, 1997

Related U.S. Application Data

[63] Continuation of Ser. No. 654,798, May 29, 1996, abandoned, which is a continuation of Ser. No. 351,758, Dec. 8, 1994, abandoned, which is a continuation of Ser. No. 942,957, Sep. 10, 1992, abandoned.

[51] Int. Cl.$^6$ ............................................. G11C 11/155
[52] U.S. Cl. .................. 365/171; 365/225.5; 365/243.5
[58] Field of Search .......................... 365/171, 55, 243.5, 365/225.5; 257/531; 29/605, 606, 604; 336/170, 171, 183, 185, 200, 205

[56] References Cited

U.S. PATENT DOCUMENTS

| | | | |
|---|---|---|---|
| 3,154,768 | 10/1964 | Hardwick | 365/171 |
| 3,305,814 | 2/1967 | Moyer | 336/200 |
| 3,418,644 | 12/1968 | Higashi et al. | 365/225.5 |
| 3,596,260 | 7/1971 | Olson et al. | 365/191 |
| 5,095,357 | 3/1992 | Andoh et al. | 357/51 |
| 5,126,971 | 6/1992 | Lin et al. | 365/171 |
| 5,157,576 | 10/1992 | Takaya et al. | 361/321 |

FOREIGN PATENT DOCUMENTS 3-46185  2/1991  Japan.

OTHER PUBLICATIONS

L. Foldy, "Faraday's Law Of Electromagnetic Induction", Encyclopedia Of Physics, Addison–Wesley Publishing Co., 1981, pp. 297–298.

A. Arrott, "Ferromagnetism", Encyclopedia Of Physics, Addison–Wesley Publishing Co., 1981, pp. 308–312.

Katz, ed., Solid State Magnetic and Dielectric Devices (1959) pp. 370–377.

*Primary Examiner*—David C. Nelms
*Assistant Examiner*—Andrew Q. Tran
*Attorney, Agent, or Firm*—Limbach & Limbach L.L.P.

[57] ABSTRACT

Integrated circuit memory elements are fabricated by disposing a first layer of electrically conductive material on the surface of an electrically insulating substrate. The first layer of electrically conductive material is formed into a first predetermined pattern. A second layer of electrically insulating material is disposed on the surface of the electrically insulating substrate and the patterned first layer of electrically conductive material. A first layer of magnetizable material is disposed on the second insulating layer and is formed into a predetermined pattern having a predetermined positional relationship with respect to the underlying patterned first layer of electrically conductive material. A third layer of electrically insulating material is disposed over the second layer of insulating material and the patterned first layer of magnetizable material. Openings are formed in the underlying layers of insulating material to expose predetermined electrical contact areas on the underlying patterned first electrically conductive layer. A second electrically conductive layer is disposed over the third layer of electrically insulating material into the openings and into electrical contact with the exposed electrical contact areas of the underlying patterned first electrically conductive layer. The second electrically conductive layer is formed into a second predetermined pattern having a predetermined positional relationship with respect to the underlying patterned layer of magnetizable material and the patterned first electrically conductive layer. The patterned first electrically conductive layer and the patterned second electrically conductive layer define at least two conductive windings disposed about the patterned magnetizable material.

7 Claims, 16 Drawing Sheets

5,748,523

1

INTEGRATED CIRCUIT MAGNETIC MEMORY ELEMENT HAVING A MAGNETIZABLE MEMBER AND AT LEAST TWO CONDUCTIVE WINDING

This is a continuation of prior complete U.S. application Ser. No. 08/654,798 filed on May 29, 1996 by Michael E. Thomas et al. for INTEGRATED CIRCUIT MAGNETIC MEMORY ELEMENT, now abandoned, which is a continuation of U.S. application Ser. No. 08/351,758 filed on Dec. 8, 1994, now abandoned, which is a continuation of U.S. application Ser. No. 07/942,957 filed on Sep. 10, 1992, now abandoned.

BACKGROUND OF THE INVENTION

The present invention relates to integrated circuits and more particularly to memories formed on a substrate as part of integrated circuits.

Memory elements in integrated circuits typically comprise capacitors, in dynamic memories, or transistors arranged to define static memory elements. Dynamic memories have the disadvantage that frequent refreshing is required in order to maintain the charge on the capacitors. Static memories are relatively complicated to fabricate and occupy a large amount of real estate in the substrate.

It is known to provide memories known as magnetic core memories comprising discrete ferromagnetic members. Magnetic-core memories do not require refreshing. However, magnetic-core memories are slow, and consume large amounts of power by present day standards. Moreover, magnetic-core memories are not available as integrated circuits.

It is an object of the invention to provide a non-volatile memory for an integrated circuit which requires a minimum of area in the substrate and is relatively simple to fabricate.

It is an object of the invention to provide a fast, low-power, memory device having magnetizable memory elements.

SUMMARY OF THE INVENTION

A memory element includes a magnetizable member formed on a substrate, and at least two conductive windings formed in the substrate and disposed about the magnetizable member.

A process for fabricating integrated circuit memory elements includes the steps of disposing a first layer of electrically conductive material on the surface of an electrically insulating substrate, forming the first layer of electrically conductive material into a first predetermined pattern, disposing a second layer of electrically insulating material on the surface of the electrically insulating substrate and the patterned first layer of electrically conductive material, disposing a first layer of magnetizable material on the second insulating layer, forming the first layer of magnetizable material into a predetermined pattern having a predetermined positional relationship with respect to the underlying patterned first layer of electrically conductive material, disposing a third layer of electrically insulating material over the second layer of insulating material and the patterned first layer of magnetizable material, forming openings in the underlying layers of insulating material to expose predetermined electrical contact areas on the underlying patterned first electrically conductive layer, disposing a second electrically conductive layer over the third layer of electrically insulating material into the openings and into electrical contact with the exposed electrical contact areas of the underlying patterned first electrically conductive layer, and forming the second electrically conductive layer into a second predetermined pattern having a predetermined positional relationship with respect to the underlying patterned layer of magnetizable material and the patterned first electrically conductive layer, the patterned first electrically conductive layer and the patterned second electrically conductive layer defining at least two conductive windings disposed about the patterned magnetizable material.

A process for fabricating integrated circuit memory elements includes the steps of disposing a first layer of electrically conductive material on the surface of an electrically-insulating substrate, forming the first layer of electrically conductive material into a first predetermined pattern, disposing a first layer of insulating material over the substrate and the patterned first electrically-conductive layer, forming openings in the first layer of insulating material to expose electrical contact areas on the underlying patterned first layer of electrically conductive material, disposing a second layer of electrically conductive material over the first insulating layer into the openings and into electrical contact with the exposed electrical contact areas on the underlying patterned first layer of electrically conductive material, forming the second layer of electrically conductive material into a predetermined pattern having a predetermined positional relationship with respect to the underlying patterned first layer of electrically conductive material, repeating the steps of disposing a layer of insulating material over the underlying layer of insulating material and the underlying patterned layer of electrically conductive material, forming openings in the newly-formed insulating layer to expose contact areas on the underlying patterned layer of electrically-conductive material, disposing a layer of electrically conductive material over the insulating layer and into electrical contact with the exposed electrical contact area, and of forming a further layer of electrically conductive material into a predetermined pattern, as required to form at least two, substantially co-axial spiral coils of conductive material, each coil having a central portion and a predetermined number of loops disposed about the central portion, disposing a final layer of electrically insulating material over the underlying layer of electrically insulating material and the underlying patterned final layer of electrically conductive material, forming an opening in the final layer of insulating material and the underlying layers of insulating material, the opening substantially aligned with the common axis of the coils, forming a layer of magnetizable material over the final insulating layer into the opening and forming the layer of magnetizable material into a predetermined pattern.

DETAILED DESCRIPTION OF A PREFERRED EMBODIMENT

Figure 1A:
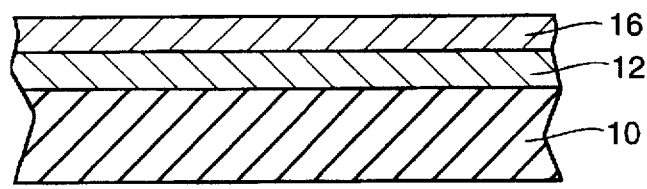
FIGS. 1A through 1L depict, in cross section and plan view, various steps of the fabrication of an integrated circuit memory element in accordance with the present invention.

The various steps in the making of a micromagnetic memory element on a substrate for an integrated circuit in accordance with the present invention are depicted in FIGS. 1A through 1K. Referring now to FIG. 1A, there is schematically depicted, in cross section, a substrate 10, which may be for example a silicon substrate. Substrate 10 may have, for example, active devices or additional magnetic memory elements according to the invention formed therein. A wide variety of materials could be used for substrate 10. For example, substrate 10 could be beryllium oxide or diamond. By way of further example, substrate 10 could be a polycrystalline material, such as alumina.

A layer 12 of insulating material, for example, silicon dioxide, is formed over substrate 10. While silicon dioxide is preferred, other materials such as spin on dielectrics and spin on glass are also suitable as insulating layer 12. The preferred thickness of insulating layer 12 is 7,500 angstroms. Insulating layer 12 may be formed, for example, by plasma enhanced chemical vapor deposition (PECVD).

If desired, at least one opening (not shown) may be formed in insulating layer 12 to expose predetermined electrical contact areas on the upper surface of substrate 10. The openings are preferably defined using a known photoresist method, and then etched using an enchant which attacks the insulating material of layer 12 but is unreactive with and stops at the underlying substrate 10.

In the embodiment where the magnetic memory elements according to the present invention are formed on an insulating substrate, neither the layer of insulating material 12 nor the openings in this layer are required.

Figure 1B:
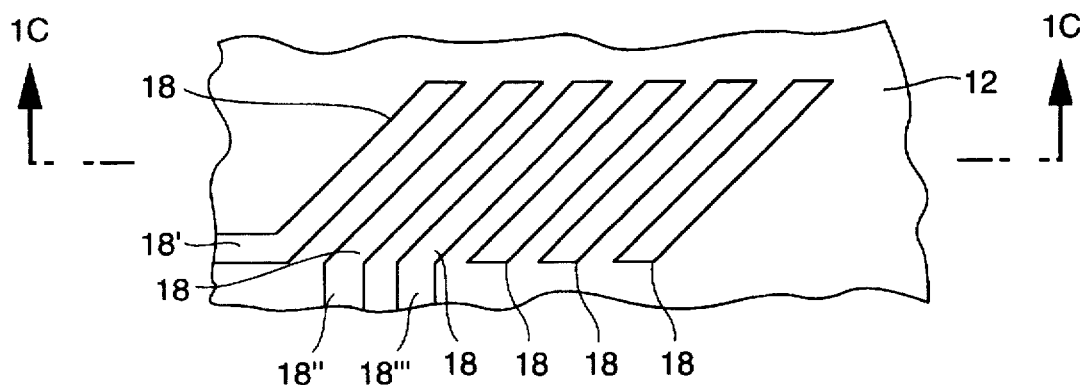
Figure 1C:
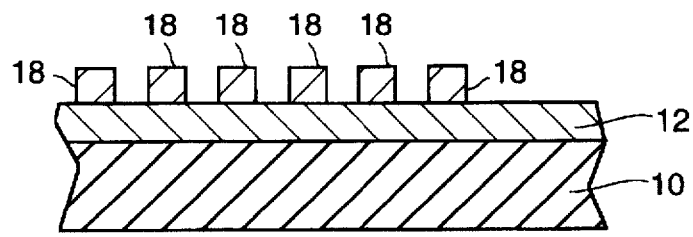

A first layer 16 of an electrically conductive material, such as aluminum or a tungsten alloy, is formed over first insulating layer 12. First electrically conductive layer 16 is preferably formed by sputtering aluminum to a predetermined thickness in the range of from about 3,000 angstroms to about 15,000 angstroms (1.5 microns), and preferably to a thickness of approximately 7,500 angstroms. Referring now to FIG. 1B, first electrically conductive layer 16 is formed into a predetermined pattern of electrically conductive segments 18 using, for example, known photoresist and etching techniques. FIG. 1C is a cross section through line C—C of FIG. 1B. It will be seen that there are provided segment extensions 18', 18" and 18"' attached to and extending from three of the electrically conductive segments 18. Extensions 18', 18" and 18"' are provided to establish electrical connections between coils of memory elements according to the invention, as will be explained below.

Figure 1D:
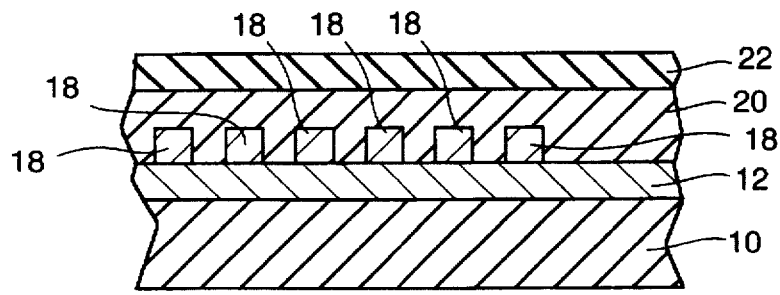

Referring now to FIG. 1D, a second layer 20 of insulating material, for example, silicon dioxide, is formed over first insulating layer 12 and electrically conductive segments 18. The thickness of second insulating layer 20 may be, for example, approximately 10,000 angstroms. If second insulating layer 20 is of silicon dioxide, then second insulating layer 20 is preferably formed using PECVD techniques. A first layer 22 of magnetizable material is disposed over second insulating layer 20, preferably by sputtering. Any one of a large number of magnetizable materials may be used. For example, first magnetizable layer 22 may be of iron, a silicon-iron alloy, a nickel-iron alloy, a cobalt-iron alloy, or other magnetizable material. The thickness of first layer 22 of magnetizable material may be from about 1000 angstroms to about 30,000 angstroms, and preferably approximately 1.5 microns.

Figure 1E:
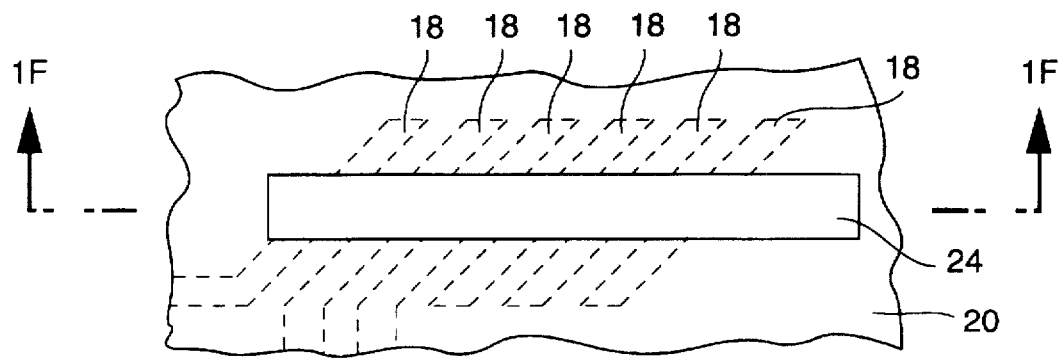
Figure 1F:
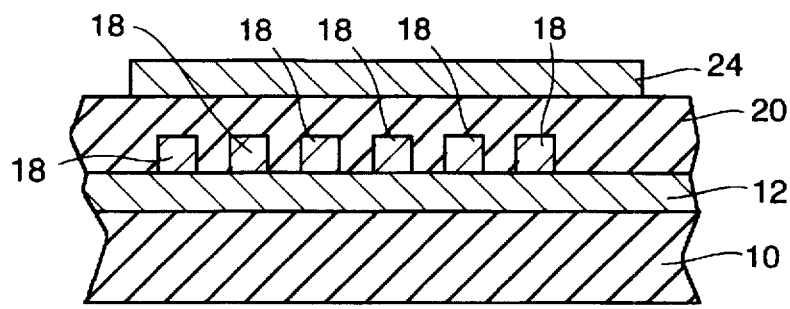

First layer of magnetizable material 22 is formed into a predetermined pattern having a predetermined positional relationship with respect to underlying segments 18 of electrically conductive material using, for example, known photoresist and etching techniques. One embodiment of this predetermined pattern 24 is depicted in FIG. 1E. As can be seen in FIG. 1E, predetermined pattern 24 of the magnetizable material has a solid, elongated, rectangular shape, and is positioned over the underlying segments 18 in substantially bisecting relationship thereto. The reason for this positional relationship between the patterned magnetizable material 24 and the underlying segments 18 will become apparent later on in this detailed description. FIG. 1F is a cross sectional view taken along lines F—F of FIG. 1E.

Figure 1G:
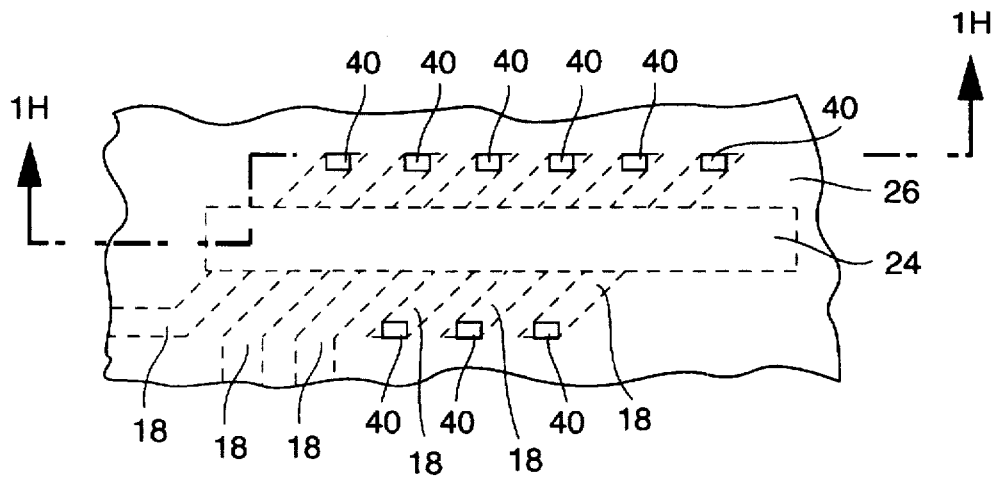
Figure 1H:
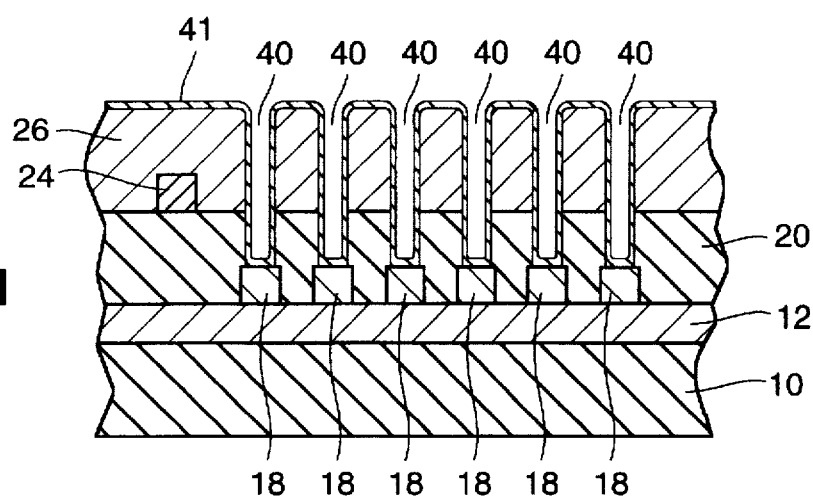

Referring now to FIG. 1G, and FIG. 1H, which is a cross sectional view taken along lines H—H of FIG. 1G, a third electrically insulating layer 26, preferably comprising silicon dioxide, is formed over second electrically insulating layer 20 and first patterned magnetic layer 24, preferably by PECVD, to a thickness of, for example, approximately 10,000 angstroms. As may best be seen in FIG. 1H, vias 40 are opened through insulating layers 26 and 20 to expose electrical contact areas on underlying patterned segments 18. The exposed electrical contact areas are preferably at selected ends of the segments 18 for reasons which will become apparent later on in this detailed description.

The vias 40 are opened using known photoresist and etching techniques. That is, for example, the openings are defined using a known photoresist method, then etched using an enchant which etches the insulating material but which stops on the surface of the underlying patterned segments 18. In those embodiments where the via openings are deep, for example, deeper than approximately 3 microns, the openings can be formed in each insulating layer following the formation of such layer or can be formed in groups of insulating layers (depending upon the thickness of each insulating layer) in order to prevent the edge depth from becoming excessive. In such cases, electrically conductive plugs are formed within the openings formed in such insulating layer or groups of insulating layers preferably by depositing a metal, such as tungsten, over the upper surface of the layer or groups of layers into the openings then etching back the metal until the top of each plug is substantially co-planar with the upper surface of the layer, or groups of layers. This is repeated for each layer or group of layers through which the openings are formed so that the individually formed plugs within each opening together form a vertical conductor which extends from the bottom to the top of each deep opening.

A nucleating layer 41 of material, such as titanium/tungsten (TiW) is disposed over the second insulating layer 26 into vias 40 and into electrical contact with the electrical contact areas exposed on the underlying segments 18. In a preferred embodiment, the nucleating layer 41 is formed by sputtering the titanium/tungsten material to a thickness of approximately 1,000 angstroms.

Figure 1I:
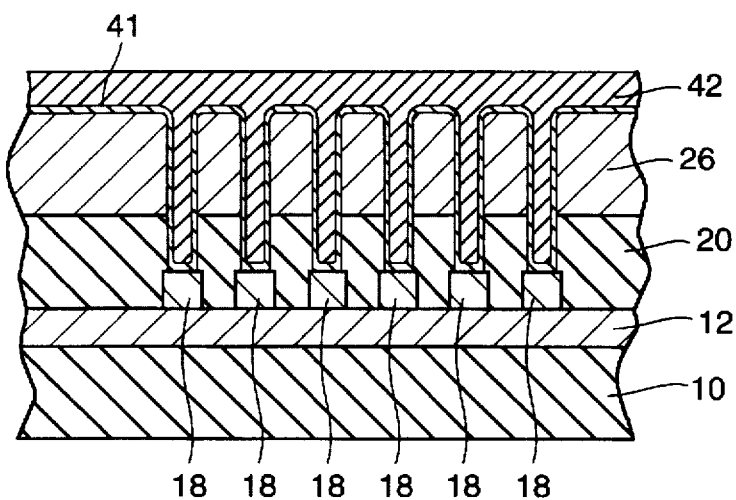
Figure 1J:
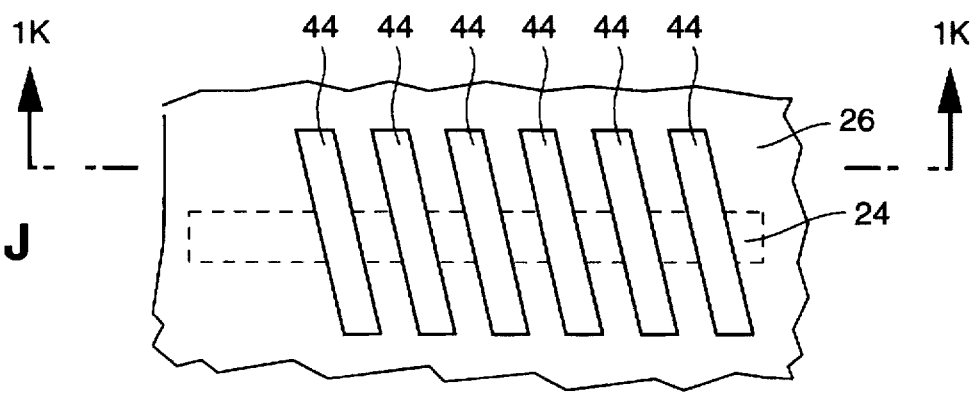
Figure 1K:
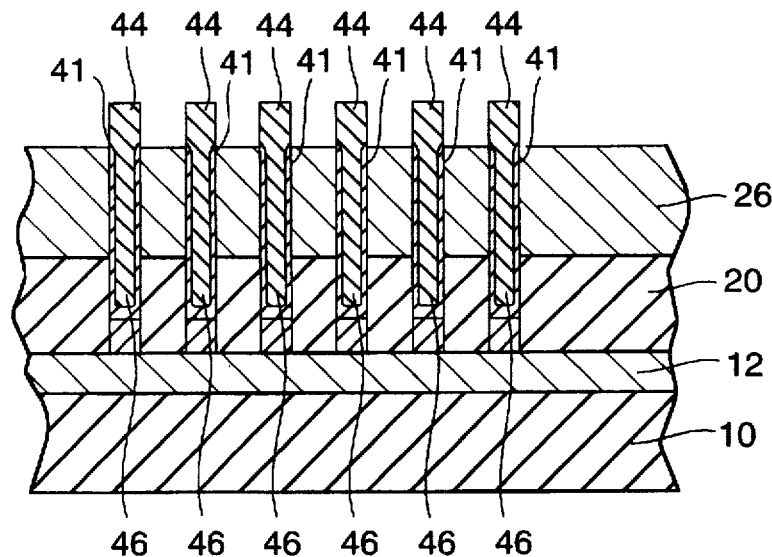
Figure 1L:
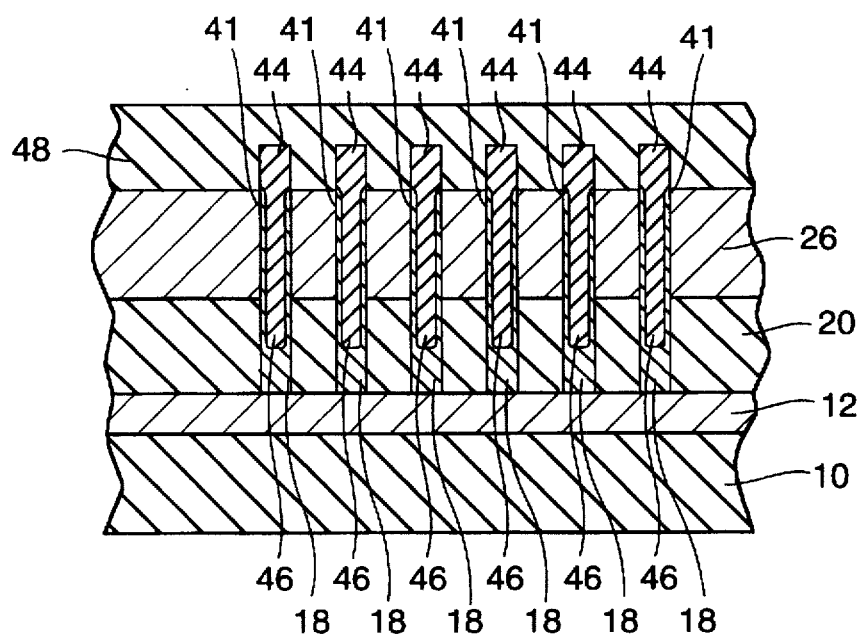

Referring to FIG. 1I, a second layer 42 of electrically conductive material, such as tungsten, is disposed over the nucleating layer 41 previously disposed over second insulating layer 26 into vias 40 and into electrical contact with the electrical contact areas exposed on the underlying segments 18 through the nucleating layer. Second electrically conductive layer 42 is preferably formed by CVD to a thickness of approximately 7,500 angstroms. Second layer 42 of electrically conductive material is patterned into electrically conductive segments 44 as shown in FIG. 1J and 1K, preferably using known photoresist and etching techniques. In the embodiment shown in FIG. 1K, the end of each electrically conductive segment 44 terminates in an electrically conductive vertical member 46 which extends down through the via 40 into contact with the underlying electrically conductive segment 18. Electrically conductive vertical member 46 includes a tungsten layer on nucleating layer 41. As shown in FIG. 1L, a layer 48 of electrically insulating material, such as silicon dioxide, phosphosilicate glass (PSG), undoped silicate glass (USG) or silicon nitride is disposed over second layer 26 of insulating material and electrically conductive segment 44, preferably by PECVD techniques to a thickness of approximately 7,500 angstroms.

Figure 2:
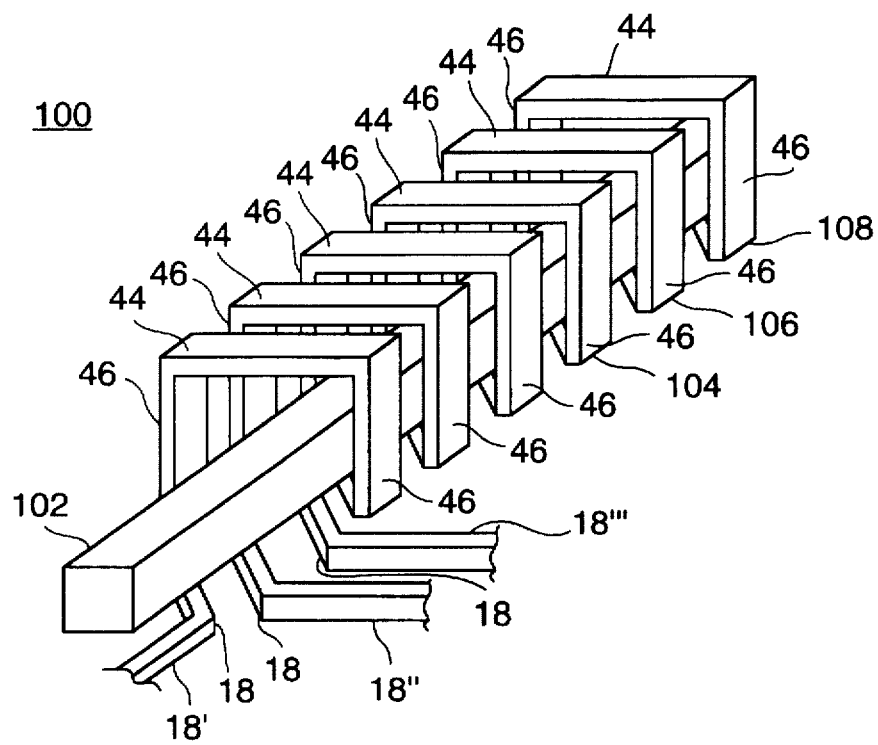
FIG. 2 is a schematic, perspective view of the windings and magnetizable member portions of the memory element fabricated in accordance with the steps depicted in FIGS. 1A through 1L.

Referring now to FIG. 2, there is depicted, schematically in perspective, a magnetic memory element 100 which has been formed in accordance with the method described above. As can be seen in FIG. 2, memory element 100 comprises magnetizable member 102 and three separate coils 104, 106, 108. Each coil is formed by two electrically conductive segments 18, two vertically conductive members 46, and at least one electrically conductive segment 44. Each coil 104, 106, 108 surrounds a portion of magnetizable member 102 as a result of the predetermined positional relationship between the patterned magnetic material and the underlying segments 18, the positioning of the vias 40, and the predetermined positional relationship among segments 44, vias 40, and underlying segments 18, as shown in FIGS. 1K–1L. Coils 104, 106, 108 are electrically isolated from one another and are interleaved.

An array of memory elements 100 may be provided on a substrate to form a memory chip. In such an array, each coil 106 is a portion of a conductor or line comprising one such coil in each of many memory elements. In a memory chip employing memory elements according to the invention, there would typically be a selected number of x-lines and a selected number of y-lines. One of the coils of each memory element would be an x-line and one of the coils of each memory element would be a y-line. Each memory element would be uniquely identified by the x-line and y-line intersecting at that memory element. The third coil of each memory element would be part of a sense line, which would include a coil in each memory element in the array.

Figure 5A:
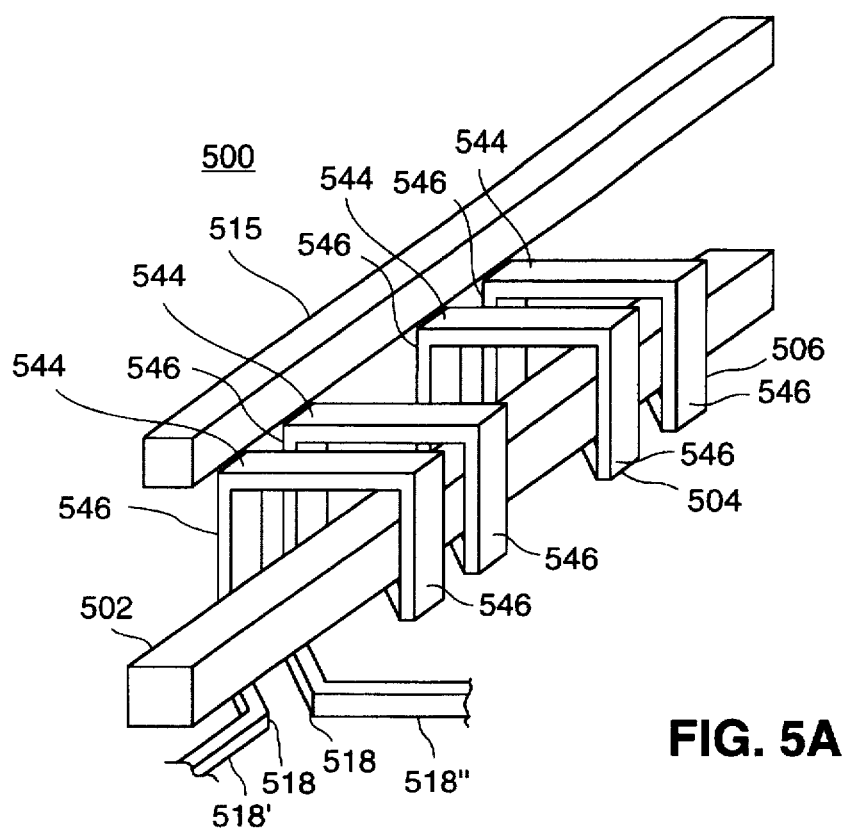
FIG. 5A is a schematic, perspective view of the windings, magnetizable member, and conductive member of a memory element according to an alternative embodiment of the invention.

Referring now to FIG. 5A, there is depicted, schematically, in perspective, a magnetic memory element 500, which is an alternative embodiment of magnetic memory element 100 described above in connection with FIG. 2. As can be seen in FIG. 5, memory element 500 comprises magnetizable member 502 and two separate coils 504 and 506. Each coil 504, 506 is formed by two electrically conductive horizontal segments 518, two vertical conductive members 546, and two horizontal electrically conductive segment 544. Extensions 518', 518" are provided at one end of coils 504, 506, to provide electrical connections to coils 504, 506. Each coil 504, 506, surrounds a portion of magnetizable member 502 as a result of a predetermined positional relationship between the patterned magnetic material that comprises magnetizable member 502, and the underlying conductive segments 518, the positioning of vias, which were filled with a metal to define vertical conductive members 546, and the predetermined positional relationship among segments 544, vertical members 546, and underlying segments 518. Coils 504, 506 are interleaved. In addition, magnetic memory element 500 comprises a straight conductive member 515. Straight conductive member 515 is disposed outward of coils 504, 506, and is electrically isolated from coils 504, 506 and from magnetizable member 502. In the embodiment illustrated in FIG. 5, straight conductive member 515 has been disposed above horizontal conductive segments 544 of coils 504, 506. However, it could be envisioned that a straight conductive segment 515 could be disposed on either side of, or below, coils 504, 506, parallel to magnetizable member 502.

Figure 5B:
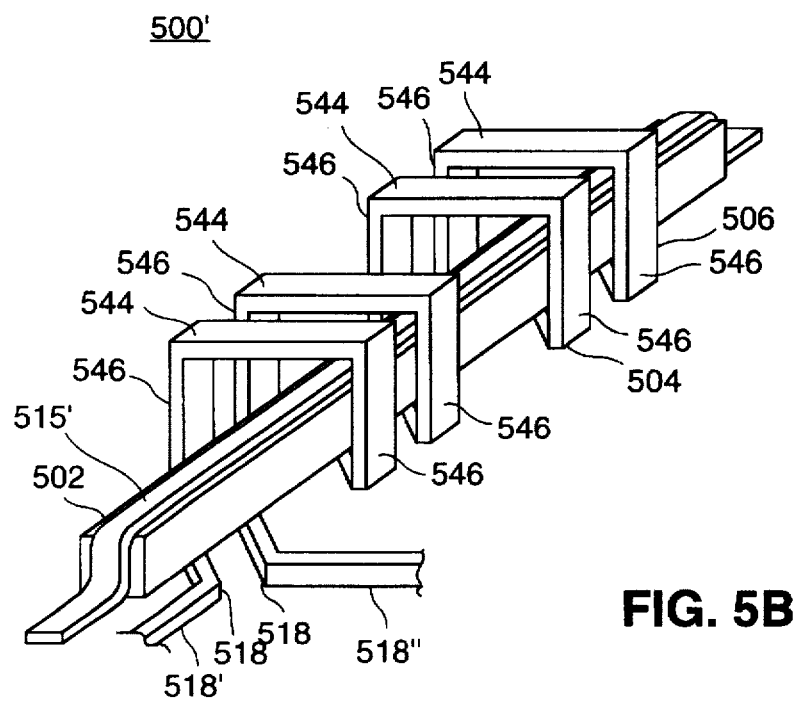
FIG. 5B is a schematic, perspective view of the windings, magnetizable member, and conductive member of a memory element according to an alternative embodiment of the invention.

Referring to FIG. 5B, there is depicted, schematically in perspective, a magnetic memory element 500', which is an alternative embodiment of magnetic memory element 500 of FIG. 5A. Memory element 500' of FIG. 5B is identical to memory element 500 of FIG. 5A, except that straight conductive member 515' is disposed interior to coils 504, 506, and in contact with magnetizable member 502. Straight conductive member 515' extends at each end beyond magnetizable member 502, so that electrical connections may be provided to conductive member 515'. In the embodiment illustrated in FIG. 5B, conductive member 515' is disposed on top of magnetizable member 502. However, numerous other configurations could be envisioned wherein conductive member 515' is disposed interior to coils 504, 506. Conductive member 515' could be disposed under or to either side of magnetizable member 502 and need not be in contact with it.

Memory element 500 is fabricated substantially in accordance with the techniques described with reference to FIGS. 1A through 1L, except that only two coils are fabricated, and not three, as described and illustrated in connection with FIGS. 1A through 1L.

Figure 6A:
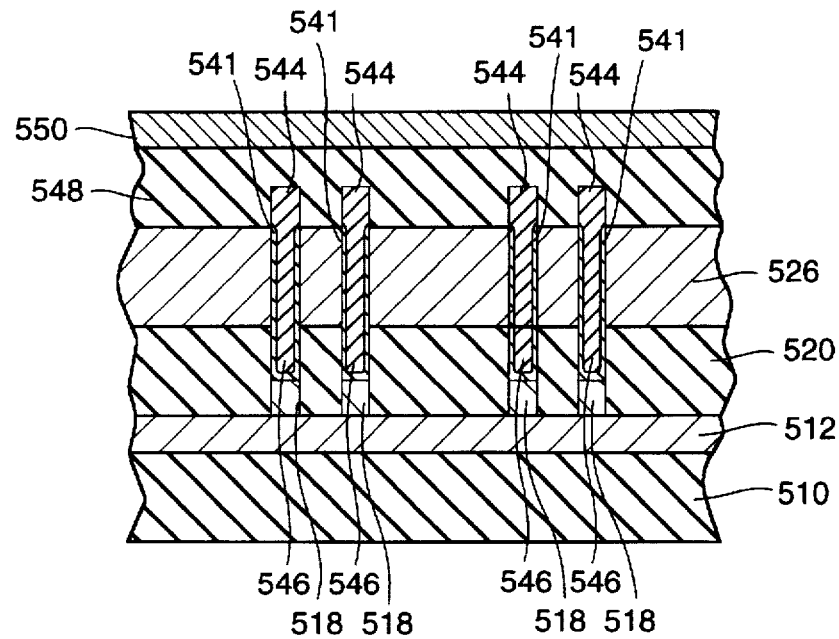
FIGS. 6A and 6B depict, in cross section and plan view, steps in the fabrication of an integrated circuit memory element according to the embodiment of FIG. 5A.
Figure 6B:
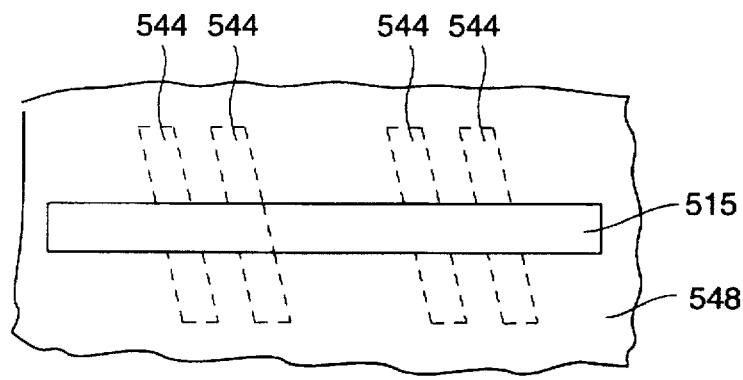

Referring to FIG. 6A, there is depicted a cross-sectional view, similar to FIG. 1L, of a step in the fabrication of memory element 500 having a magnetizable member and only two coils disposed around the magnetizable member. Thus, there is depicted substrate 510, layer 512 of insulating material formed on substrate 510, electrically conductive segments 518 formed on insulating layer 512, second insulating layer 520 formed over first insulating layer 512 and electrically conductive segments 518, third electrically insulating layer 526 formed over second electrically insulating layer 520, electrically conductive segments 544 formed on second electrically insulating layer 526, vertical electrically conductive members 546 (which include nucleating layer 541) extending downward from electrically conductive segments 544 through insulating layers 526, 520, into contact with underlying electrically conductive segments 518, and layer 548 of electrically insulating material disposed over second insulating layer 526 and electrically conductive segments 544. It will be appreciated that the cross-sectional view shown in FIG. 6A is similar to the cross-sectional view depicted in FIG. 1L. Third layer 550 of electrically conductive material, such as aluminum or a tungsten alloy, is formed over insulating layer 548. Third electrically conductive layer 550 is preferably formed by sputtering aluminum to a predetermined thickness in the range of from about 3,000 angstroms to about 15,000 angstroms, and preferably to a thickness of approximately 7,500 angstroms. Referring now to FIG. 6B, which is a top view, third electrically conductive layer 550 is formed into a predetermined pattern, defining a straight segment 515 using, for example, known photoresist and etching techniques. Straight conductive segment 515 is located in predetermined positional relationship to conductive segments 544 and to magnetizable member 502.

The embodiment of FIG. 5B may be fabricated by forming, in accordance with the methods discussed above in connection with FIGS. 1A through 1F (except that only two coils are formed), underlying segments of coils 504, 506, a dielectric layer over the underlying segments, and magnetizable member 502 on the dielectric layer. A metal layer, which may be of aluminum or a tungsten alloy, for example, is then formed over magnetizable member 502 and the surface of the underlying dielectric layer. The metal layer is then patterned in accordance with conventional techniques, to define segment 515'.

Straight conductive segment 515 may act as a sense line for memory element 500, and straight conductive segment 515' may act as a sense line for memory element 500'. In the embodiments of FIGS. 5A and 5B, one of coils 504, 506, would be a portion of an x-line, and the other of coils 504, 506, is a portion of a y-line. As currents in the x-line and the y-line must together provide a sufficiently strong magnetic field to change the direction of magnetization of magnetizable member 502, it is desirable that both the x-line and the y-line be provided as coils about magnetizable member 502. However, the sense line need only be in sufficiently close proximity to magnetizable member 502 that the reversal of the magnetic field of magnetizable member 502 will cause a current in the sense line. As a result, straight segment 515 or straight segment 515' may provide a portion of a sense line, which can detect a change in the orientation of magnetization of magnetizable member 502. As only two coils are required, the process of fabrication of memory element 500 of FIG. 5A or memory element 500' of FIG. 5B, is simpler than the process of fabrication of memory element 100 of FIG. 2.

Numerous advantages are obtained by a memory element according to the invention. Unlike conventional DRAM memory elements, no refresh is necessary in a memory element according to the invention. Unlike conventional SRAM memory elements, a memory element according to the invention does not require numerous transistors. The fact that the memory element according to the invention is disposed in a substrate means that heat dissipation, and hence power handling, will be better than that in prior art core memories. By providing the memory element of the invention in a substrate, it is possible to provide a three-dimensional array of memory elements which greatly enhances the storage density in comparison with transistor-based memories. In a memory array comprising memory elements according to the present invention, high frequency performance should be achievable, because of the small size of the magnetizable members.

Although, in the embodiment depicted in FIG. 2, there are two loops for each of the three independent helical coils, the electrically conductive layers 16 and 42 and the vias 40 can be patterned to accommodate different numbers of loops in the coils, depending on the desired electrical and magnetic characteristics of a particular memory element. Similarly, in the embodiment depicted in FIG. 5A and 5B, there are two loops for each of the two independent helical coils, but the electrically conductive layers and the vias can be patterned to accommodate different numbers of loops in the coils. It should also be noted that although the preferred embodiment described above consists of a single layer of magnetizable material to form the magnetizable member, the magnetizable member could be constructed with laminated layers of magnetizable material. This may be accomplished by, after forming second insulating layer 26 on patterned magnetizable material 24, forming a second layer of magnetizable material, patterning a second layer of magnetizable material to have substantially the same shape and dimensions as first magnetizable layer 24 and disposing another insulating layer on the second magnetizable layer. Alternatively, the magnetizable member could be constructed with laminated layers of magnetizable material by, after forming layer 22 of magnetizable material, forming an insulating layer on magnetizable layer 22, forming a second layer of magnetizable material on the insulating layer, disposing another insulating layer on the second layer of magnetizable material, and then patterning both layers of magnetizable material and both layers of insulating material to define a magnetizable member. Magnetizable member 502 of FIGS. 5A and 5B could similarly be constructed with laminated layers of magnetizable material. It should further be noted that, although the process described in this detailed description utilizes thin film technology for constructing the memory element, in accordance with the present invention, thick film technology, for example, forming the metal layers by plating, can also be effectively employed.

The memory elements depicted in FIGS. 2, 5A and 5B have been constructed such that the axis of the helical coils, and the magnetizable member, are substantially parallel with respect to the surface of the underlying substrate. In this configuration, the memory element spreads out over the surface of the substrate and could occupy a relatively substantial portion of real estate of the integrated circuit depending upon the number of loops in the coils. This disadvantage can be circumvented by stacking layers of these horizontal elements on one another. In order to conserve the area, per layer, occupied by the memory elements, the array could be constructed such that the axes of the coils are substantially perpendicular to the surface of the underlying substrate, and the magnetizable members are also substantially perpendicular to the surface of the underlying substrate, for example, as shown schematically in perspective in FIG. 3. In the configuration depicted in FIG. 3, magnetizable member 302, and the common axis of coils 304, 306 and 308, of memory element 300, are substantially perpendicular to the underlying substrate (not shown).

Figure 3:
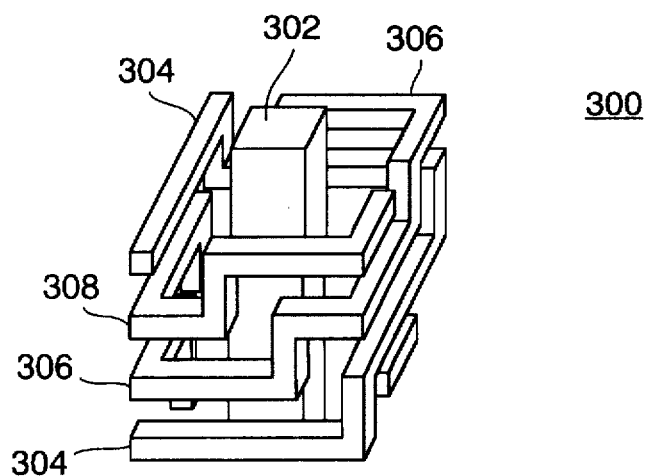
FIG. 3 is a schematic, perspective view of the windings and magnetizable member of a memory element according to an alternative embodiment of the invention.
Figure 4A:
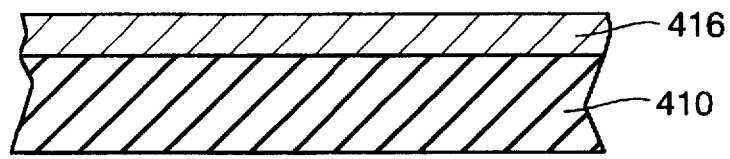
FIGS. 4A through 4T depict, in cross section and plan view, various steps in the fabrication of an integrated circuit memory element according to the embodiment of FIG. 3.
Figure 4B:
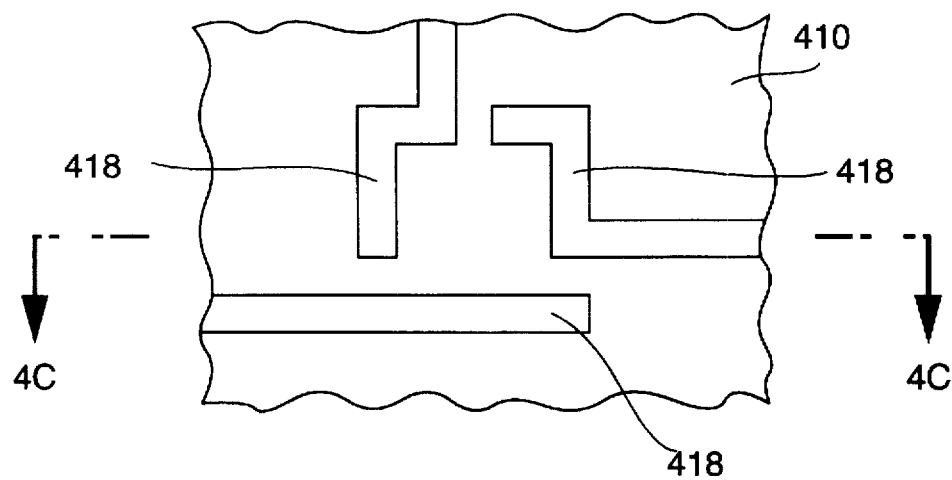
Figure 4C:
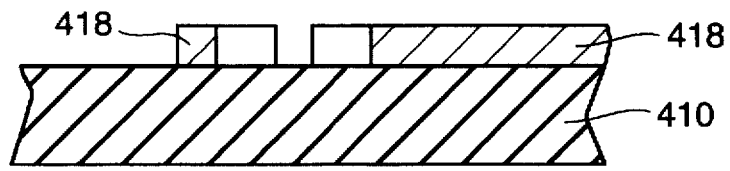
Figure 4D:
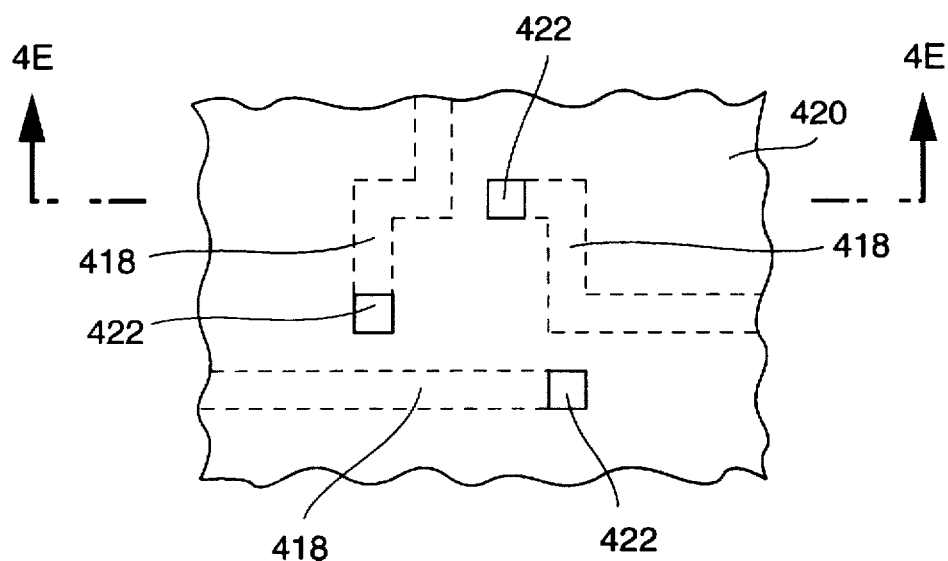
Figure 4E:
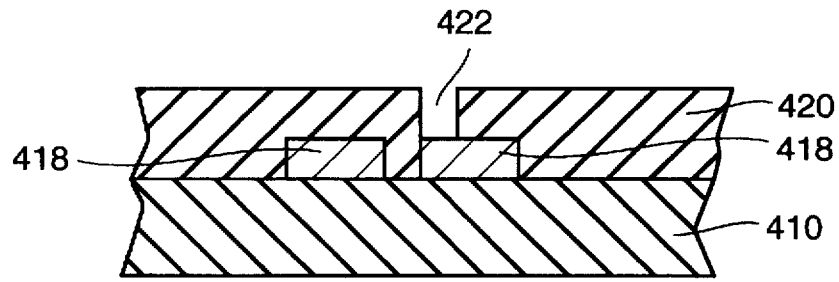
Figure 4F:
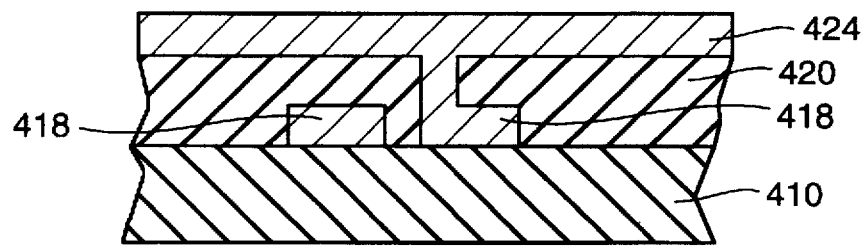
Figure 4G:
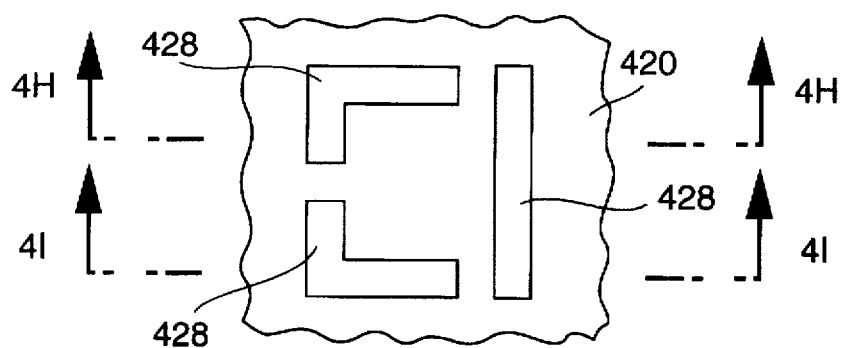
Figure 4H:
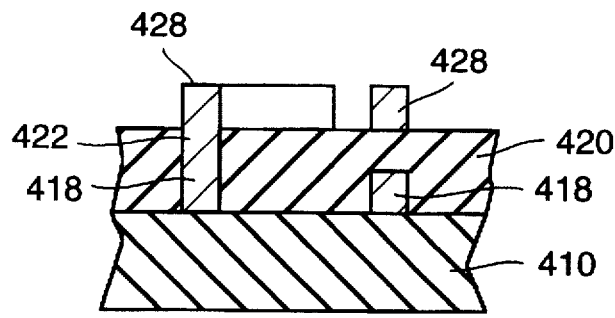
Figure 4I:
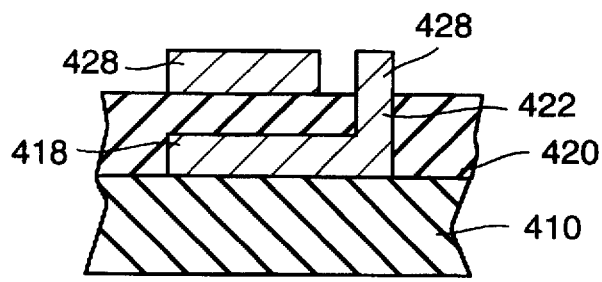
Figure 4J:
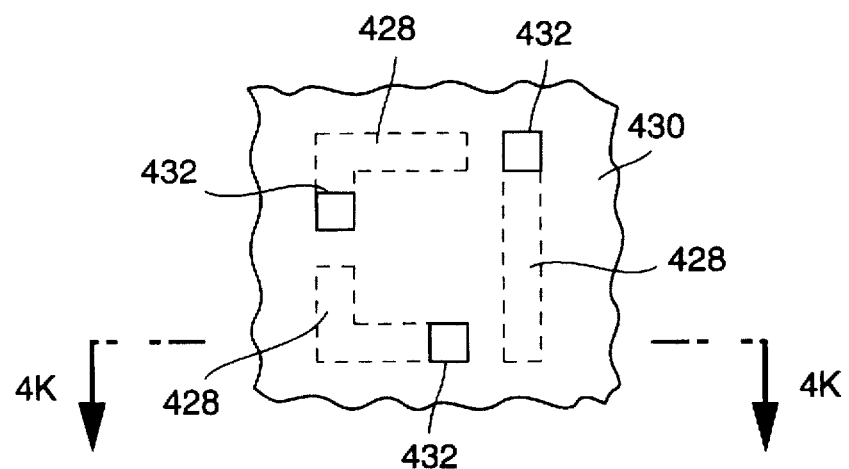
Figure 4K:
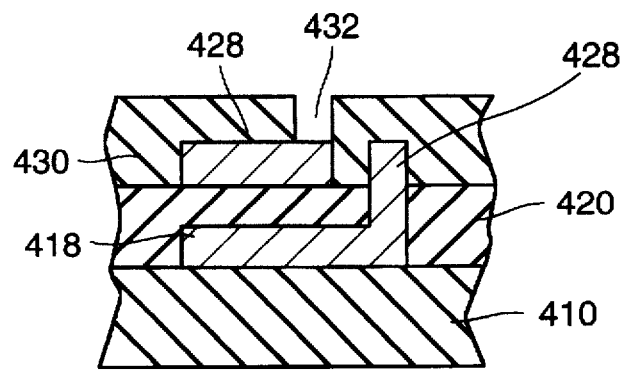
Figure 4L:
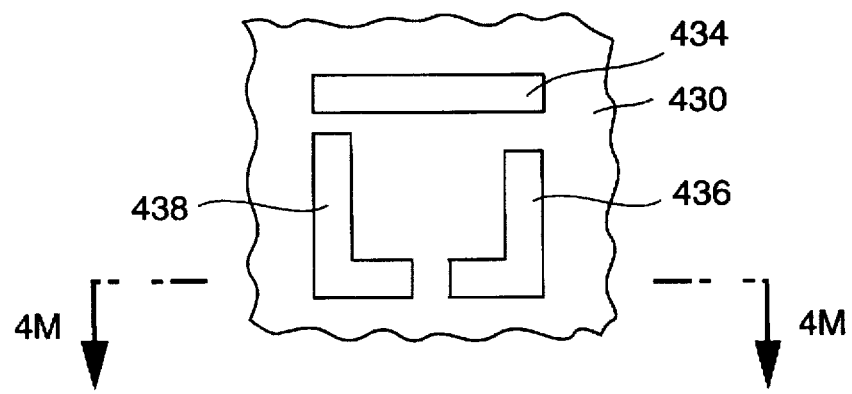
Figure 4M:
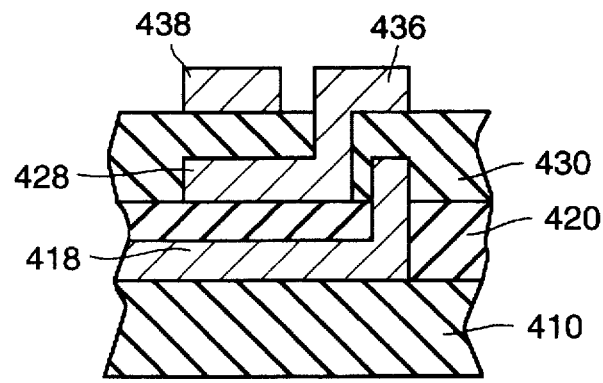
Figure 4N:
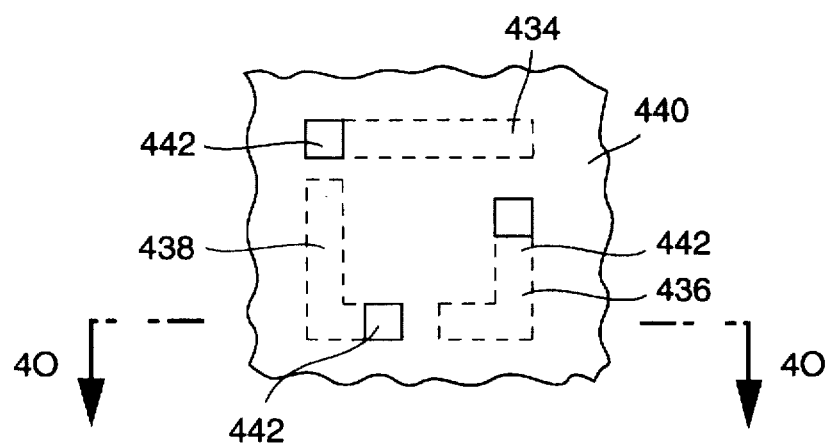
Figure 4O:
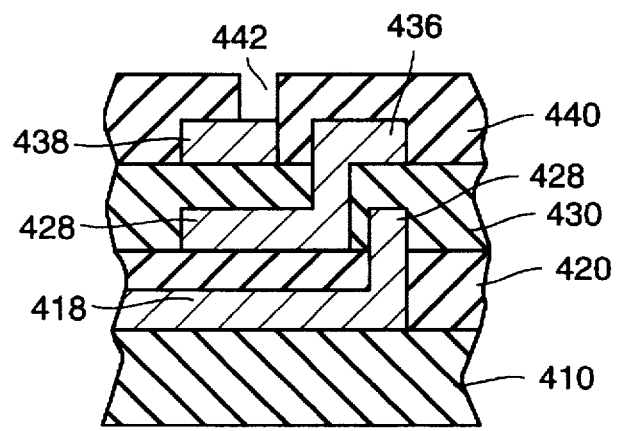
Figure 4P:
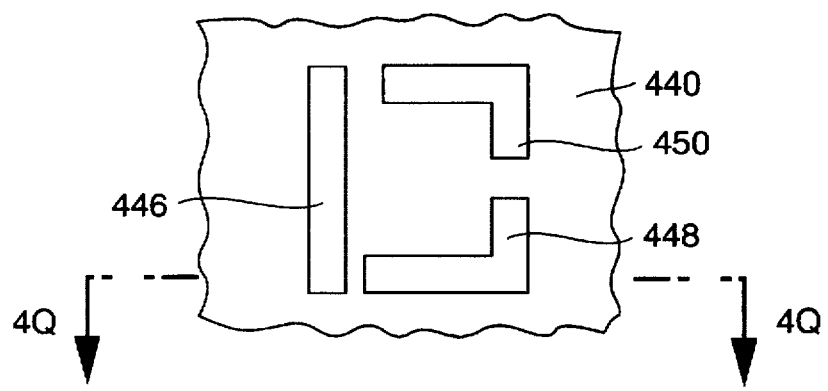
Figure 4Q:
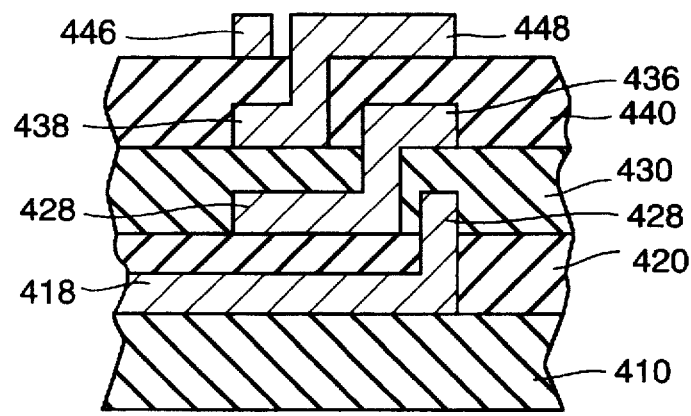
Figure 4R:
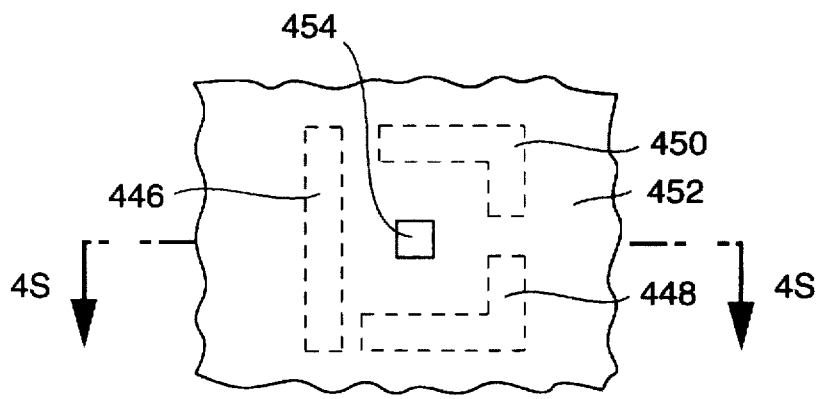
Figure 4S:
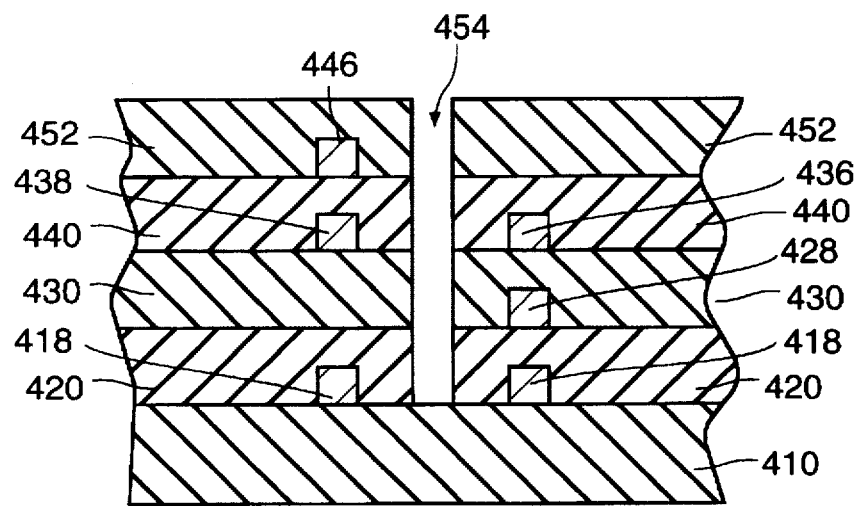
Figure 4T:
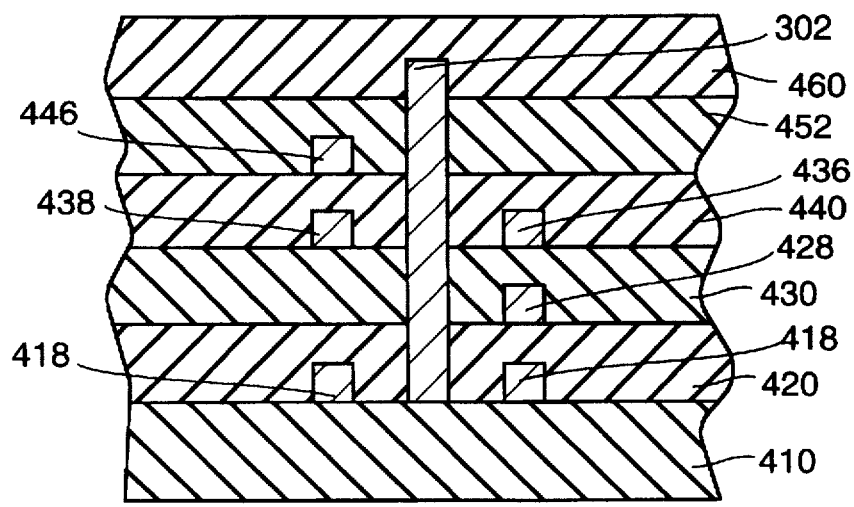

The various steps in the making of a memory element in an integrated circuit in accordance with the embodiment of the present invention depicted in FIG. 3 are shown in FIGS. 4A through 4T. The methods employed for forming the various layers, the thicknesses of the layers, and the methods employed for forming the vias and the predetermined patterns in the electrically conductive and magnetizable layers are preferably the same as those described above in connection with FIGS. 1A through 1L. Referring now to FIG. 4A, there is schematically depicted, in cross section, a substrate 410, for example, a silicon substrate. Substrate 410 can be any type of material which could be used to make integrated circuits, for example, silicon or gallium arsenide; alternatively, substrate 410 could be a passive substrate such as aluminum oxide. It should be noted that substrate 410 could also comprise a substrate of insulating material for supporting additional memory elements formed in accordance with the present invention. In this alternate embodiment of the present invention, the memory elements are electrically connected to similar memory elements in a two or three-dimensional array, so that each of the coils in each memory element forms a portion of a relatively long conductor which comprises a plurality of coils of memory elements in an array.

A first layer 416 of an electrically conductive material, such as aluminum, is formed over substrate 410. Referring now to FIG. 4B and to FIG. 4C, which is a cross section of FIG. 4B through lines C—C, first electrically conductive layer 416 is formed into a predetermined pattern of segments 418 using, for example, known photoresist and etching techniques. Segments 418 form a portion of each of the three coils 304, 306, and 308 depicted in FIG. 3, and conductive leads for electrically joining to corresponding coils of adjacent memory elements in a memory chip employing memory elements according to the invention.

Referring now to FIG. 4D, and FIG. 4E, which is a cross section of FIG. 4D through lines E—E, a first electrically insulating layer 420 is formed over substrate 410 and first patterned electrically conductive layer 418. Openings, or vias 422, are formed in first electrically insulating layer 420 to expose predetermined electrical contact areas on the upper surface of each electrically conductive segment 418. As shown, vias 422 are disposed to expose contact areas at one end of each segment 418. Vias 422 are formed, for example, using known photoresist and etching techniques.

Referring now to FIG. 4F, a second layer 424 of an electrically conductive material, such as aluminum, is formed over first insulating layer 420 and into vias 422 and into contact with the exposed selected contact areas on underlying segments 418. Second electrically conductive layer 424 is formed into a predetermined pattern of segments 428, as shown in FIG. 4G, and FIG. 4H, which is a cross section of FIG. 4G taken along the lines H—H, and in FIG. 4I, which is a cross section of FIG. 4G taken along the lines I—I. The predetermined pattern of segments 428 is formed using, for example, known photoresist and etching techniques.

Referring now to FIG. 4J, and FIG. 4K, which is a cross section of FIG. 4J taken along the lines K—K, a second insulating layer 430 is formed over segments 428 and first insulating layer 420. Vias 432 are formed in second insulating layer 430 to expose predetermined contact areas on underlying segments 428. The contact areas are disposed, for example, at one end of each segment 428. Vias 432 are formed using, for example, known photoresist and etching techniques.

Referring now to FIG. 4L and to FIG. 4M, which is a cross section of 4L taken along the lines M—M, a third layer of an electrically conductive material, such as aluminum, is formed over second insulating layer 430 into vias 432 into contact with the exposed areas on underlying conductive segments 428. The third electrically conductive layer is formed into a predetermined pattern of electrically conductive segments 434, 436, and 438, using, for example, known photoresist and etching techniques. Segment 434 corresponds to a portion of first coil 304 of memory element 300 depicted in FIG. 3. Segment 436 corresponds to a portion of second coil 306 of memory element 300 of FIG. 3. Segment 438 corresponds to a portion of third coil 308 of memory element 300 depicted in FIG. 3.

Referring now to FIG. 4N and FIG. 4O, which is a cross section of FIG. 4N along the line O—O, there is formed a third insulating layer 440 over segments 434, 436 and 438, and second insulating layer 430. Vias 442 are formed in third insulating layer 440 to expose contact areas on the underlying segments 434, 436 and 438. Vias 442 are preferably located at predetermined locations at an end of each of segments 434, 436 and 438. Vias 442 are formed using, for example, known photoresist and etching techniques.

Referring now to FIG. 4P, and FIG. 4Q which is a cross section of FIG. 4P taken along lines Q—Q, a fourth layer of electrically conductive material, such as aluminum, is formed over third insulating layer 440 and into vias 442 and in contact with the exposed areas on underlying segments 434, 436 and 438. The fourth electrically conductive layer is formed into a predetermined pattern of electrically conductive segments 446, 448 and 450 using, for example, known photoresist and etching techniques. Segment 446 corresponds to a portion of first coil 304 of memory element 300 depicted in FIG. 3. Segment 448 corresponds to a portion of second coil 306 of memory element 300 depicted in FIG. 3. Segment 450 corresponds to a portion of third coil 308 of memory element 300 depicted in FIG. 3. It will be understood that a segment of each coil 304, 306 and 308 has been defined in the above-described steps in each layer of conductive material.

Referring now to FIG. 4R, and FIG. 4S which is a cross section of FIG. 4R taken along lines S—S, a top insulating layer 452 has been formed over segments 446, 448 and 450, and insulating layer 440. Top insulating layer 452 may be of, for example, silicon dioxide. Via 454 is formed through insulating layer 452, and through all intermediate insulating layers to and including insulating layer 420. Via 454 is disposed at the common axis of coils 304, 306 and 308. Thus, a portion of each insulating layer is provided separating each electrically conductive segment from via 454. In those embodiments where via 454 is excessively deep, for example, deeper than approximately three microns, via 454 can be formed, if desired, in each insulating layer following the formation of such layer or can be formed in groups of insulating layers (depending upon the thickness of each insulating layer) in order to prevent the etching depth from becoming excessive.

A layer of magnetizable material is formed over top insulating layer 452 into via 454. The magnetizable material may be any magnetizable material listed above in connection with the method illustrated in FIG. 1. If the number and thickness of the insulating layers is such that formation of the magnetizable material into via 454 becomes difficult or impractical, segments of the magnetizable member can be formed into vias which are formed into individual insulating layers, or groups of insulating layers, depending upon the thicknesses. The layer of magnetizable material is formed into a predetermined pattern, so as to define a magnetizable member, such as that shown at 302 in FIG. 4T. A final layer of insulating material 460 is then formed over top insulating layer 452 and magnetizable member 302. If desired, vias (not shown) may be formed through final insulating layer 460 and top insulating layer 452 to expose predetermined contact areas on segments 446, 448 and 450. These vias may then be filled with conductive materials to provide connections to interconnects (not shown) to adjacent memory elements in an array, or to other devices associated with such a memory array.

Figure 7A:
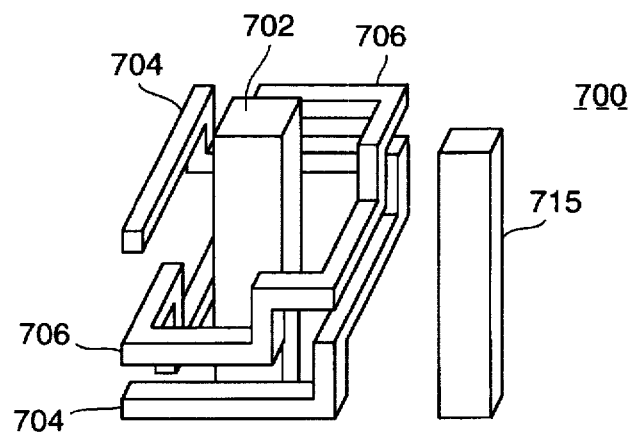
FIG. 7A is a schematic, perspective view of the windings, magnetizable member, and conductive member of a memory element according to an alternative embodiment of the invention.

Referring now to FIG. 7A, there is depicted, schematically in perspective, a magnetic memory element 700 which is an alternative embodiment of the configuration in which the axes of the coils are substantially perpendicular to the surface of the underlying substrate, and the magnetizable member is also substantially perpendicular to the surface of the underlying substrate. The memory element 700 depicted in FIG. 7A includes magnetizable member 702, conductive coils 704, 706, and straight conductive member 715 disposed outwardly from coils 704, 706, and substantially parallel to magnetizable member 702.

Figure 7B:
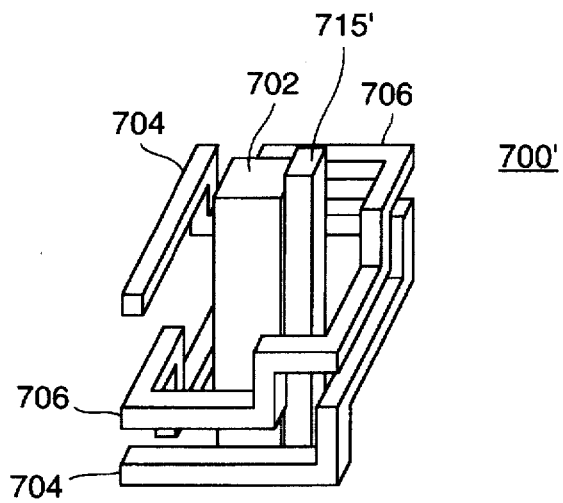
FIG. 7B is a schematic, perspective view of the windings, magnetizable member and conductive member of a memory element according to an alternative embodiment of the invention.

Referring to FIG. 7B, there is depicted, schematically in perspective, magnetic memory element 700' which is an alternative embodiment of the configuration in which the axes of the coils are substantially perpendicular to the underlying substrate, and the magnetizable member is also substantially perpendicular to the underlying substrate. The memory element 700, of FIG. 7B includes magentizable member 702, conductive coils 704, 706, and straight conductive member 715' disposed inwardly of, and electrically isolated from, coils 704, 706, and substantially parallel to magnetizable member 702. Straight conductive member 715' is depicted in contact with magnetizable member 702, although straight conductive element 715' could be electrically isolated from magnetizable member 702.

Figure 8A:
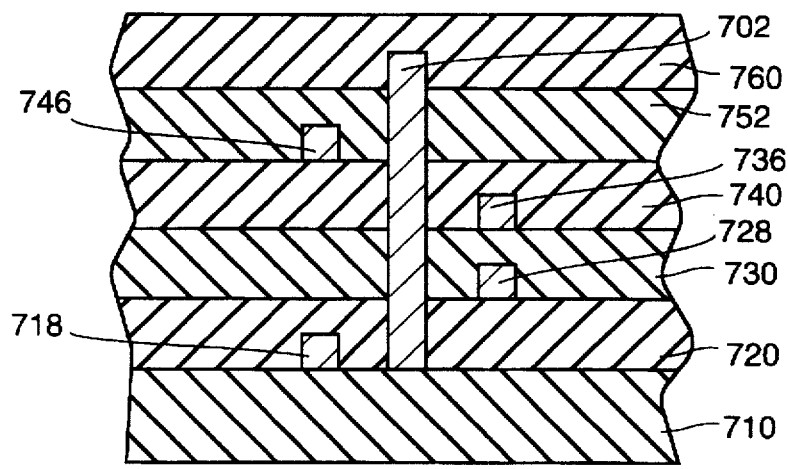
FIGS. 8A through 8D depict, in cross-section, various steps in the fabrication of an integrated circuit memory element according to the embodiment of FIG. 7A.

Memory element 700 of FIG. 7A is fabricated substantially in accordance with the techniques described above in connection with FIGS. 4A through 4T, except that only two conductive coils, rather than the three formed in the process discussed in connection with FIGS. 4A through 4T, are fabricated. Referring now to FIG. 8A, there is depicted in cross-section a step, similar to the step depicted in FIG. 4T, in the fabrication of a memory element 700 of FIG. 7A. Thus, there is provided a substrate 710, conductive segment 718 formed on substrate 710, insulating layer 720 formed on substrate 710 and conductive segment 718, conductive segment 728 formed on insulating layer 720, insulating layer 730 formed on conductive segment 728 and insulating layer 720, conductive segment 736 formed on insulating layer 730, insulating layer 740 formed on conductive segment 736 and insulating layer 730, conductive segment 746 formed on insulating layer 740, insulating layer 752 formed on conductive segment 746 and insulating layer 740, magnetizable member 702 formed through insulating layers 752, 740, 730, and 720, to substrate 710, and patterned on insulating layer 750, and final insulating layer 760 formed on magnetizable member 702 and insulating layer 752.

Figure 8B:
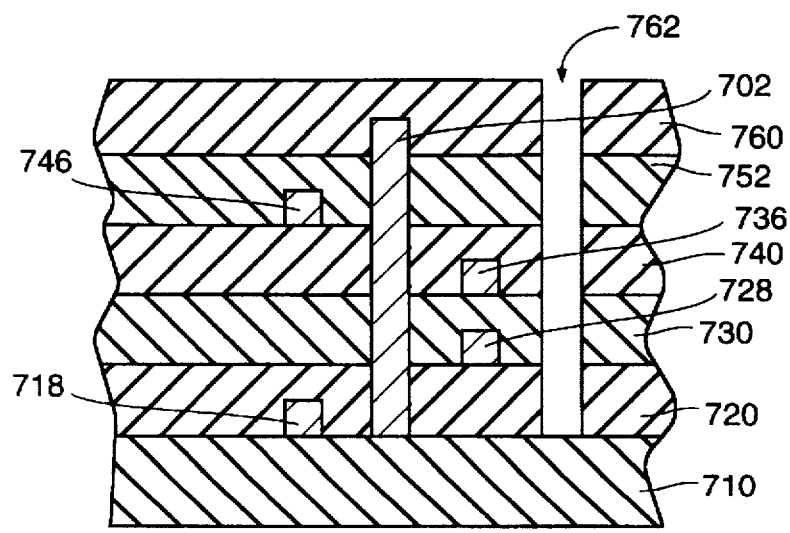

Referring to FIG. 8B, there has been formed via 762 through insulating layer 760, and through all intermediate insulating layers to and including insulating layer 720. Via 762 is disposed outwardly from coils 704 and 706. Thus, a portion of each insulating layer is provided separating each electrically conductive segment, as well as magnetizable member 702, from via 762. In those embodiments where via 762 is excessively deep, for example, deeper than approximately 3 microns, via 762 can be formed, if desired, in each insulating layer following the formation of such layer or can be formed in groups of insulating layers (depending upon the thickness of each insulating layer) in order to prevent the etching depth from becoming excessive.

Figure 8C:
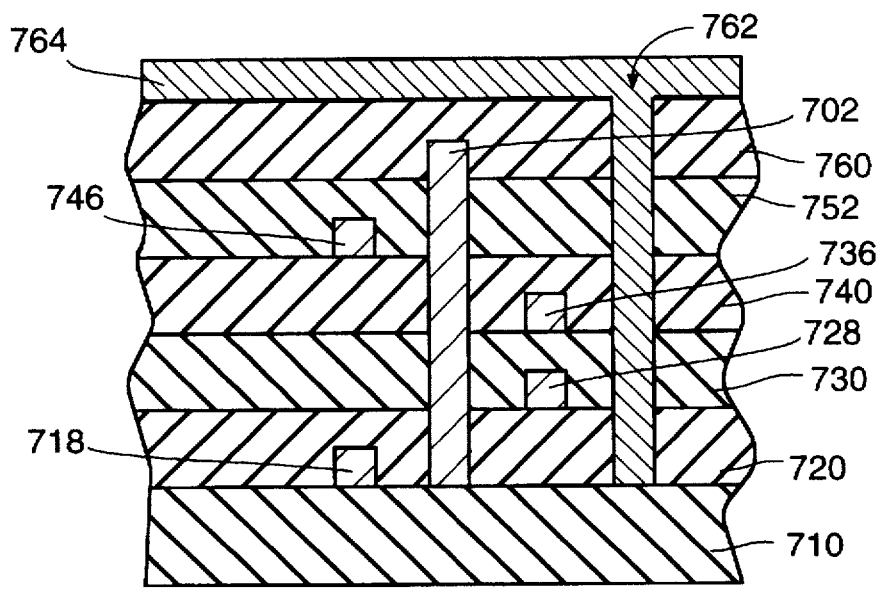
Figure 8D:
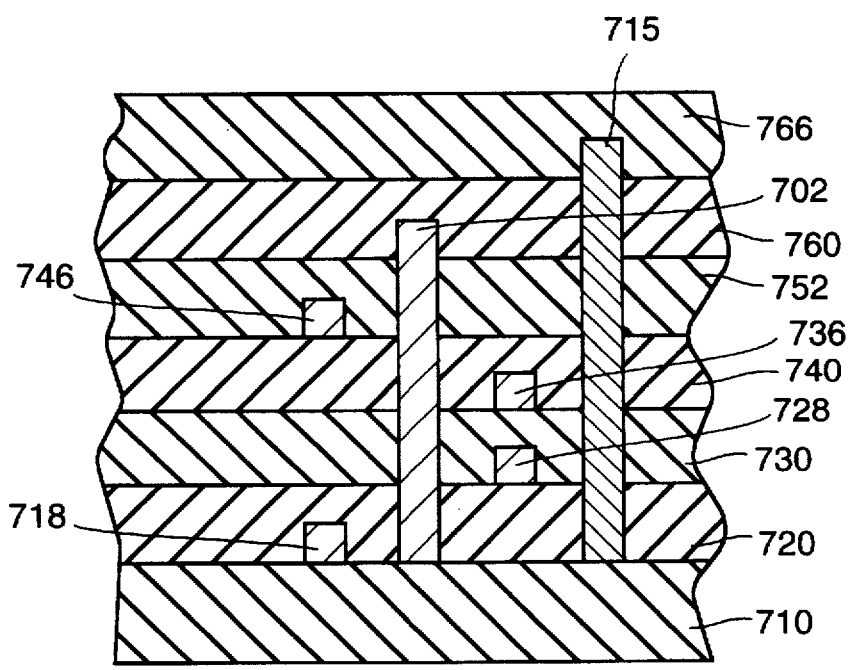

Referring to FIG. 8C, a layer of conductive material 764 is formed over insulating layer 760 and into via 762. The conductive material may be, for example, aluminum, or an alloy of tungsten. If the number and thickness of the insulating layers is such that formation of the conductive material into via 762 becomes difficult or impractical, segments of the conductive member can be formed into vias which are formed into individual insulating layers, or groups of insulating layers, depending upon the thicknesses. Layer 764 of conductive material is formed into a predetermined pattern, so as to define a straight conductive member, such as that shown at 715 in FIG. 7A. Referring to FIG. 8D, a final layer of insulating material 766 is then formed over insulating layer 762 and conductive member 715. It will be appreciated then, in the configuration shown in FIG. 7A, one of coils 704, 706, is a portion of an x-line, and the other of coils 704, 706, is a portion of a y-line. Straight conductive member 715 is a portion of a sense line. Straight conductive member 715 need only be placed in sufficiently close proximity to magnetizable member 702 that, upon reversal of the magnetic field of magnetizable member 702, a detectible current will be produced in conductive member 715.

Similarly, memory element 700' of FIG. 7B is fabricated substantially in accordance with the techniques described above in connection with FIGS. 4A through 4G, except that only two conductive coils, rather than the three formed in the process discussed in connection with FIGS. 4A through 4T, are fabricated. Subsequent to the formation of vertical magnetizable member 702 and coils 704, 706, on a substrate and the formation of top insulating layer over the magnetizable member, a via is formed, interior to coils 704, 706, and having one wall defined by a side of magnetizable member 702, through all layers of insulating material to the underlying substrate. A metal layer, which may be of aluminum or an alloy of tungsten, for example, is formed over the top insulating layer and into and filling the via. The metal layer is then patterned to define a straight conductive member.

It will be appreciated that, in the configuration depicted in FIG. 7B, one of coils 704, 706, is a portion of an x-line, and the other of coils 704, 706, is a portion of a y-line. Straight conductive member 715' is a portion of a sense line.

It will be understood that in any of the above embodiments, a mask can be formed over the final dielectric, and vias can be opened to the conductive members for the purpose of providing electrical connections to the memory element.

It will be appreciated that there are considerable variations that can be accomplished in a method and apparatus of the invention without departing from its scope. As a result, although preferred embodiments of a method and apparatus of the invention have been described above, it is emphasized that the invention is not limited to a preferred embodiment, and there exist other alternative embodiments that are fully encompassed within the invention's scope, which is intended to be limited only by the scope of the appended claims.

What is claimed is:

1. A memory element comprising:

(a) a magnetizable member formed on a substrate;

(b) at least two conductive windings formed on said substrate and disposed substantially encompassing said magnetizable member, each of said conductive windings having a first end and a second end, each of said windings being connected at said first and second ends thereof to a conductive line in a memory array; and (c) a sense conductive member formed on said substrate and disposed in proximity to said magnetizable member and electrically connected to a sense line of said memory array, wherein said magnetizable member and an axis of each of said conductive windings are substantially perpendicular to a surface of the substrate.

2. A memory element comprising:

(a) a magnetizable member formed on a substrate;

(b) at least two conductive windings formed on said substrate and disposed substantially encompassing said magnetizable member, each of said conductive windings having a first end and a second end, each of said windings being connected at said first and second ends thereof to a conductive line in a memory array; and (c) a sense conductive member formed on said substrate and disposed in proximity to said magnetizable member and electrically connected to a sense line of said memory array, wherein said windings have a common axis.

3. A memory element as recited in claim 2, wherein said sense conductive member is spaced apart from and electrically insulated from said magnetizable member.

4. A memory element as recited in claim 2, wherein said sense conductive member is substantially straight throughout an entire portion of said sense conductive member that is disposed in proximity to said magnetizable member, said entire portion being formed substantially parallel to said magnetizable member.

5. A memory element as recited in claim 4, wherein said sense conductive member is in contact with said magnetizable member throughout said entire portion of said sense conductive member.

6. A memory element as recited in claim 4, wherein said sense conductive member is disposed outward of said windings.

7. A memory element as recited in claim 4, wherein said sense conductive member is disposed inward of said windings.

* * * * *

UNITED STATES PATENT AND TRADEMARK OFFICE
CERTIFICATE OF CORRECTION

PATENT NO. : 5,748,523
DATED : May 5, 1998
INVENTOR(S) : Thomas et al.

It is certified that error appears in the above-indentified patent and that said Letters Patent is hereby corrected as shown below:

On the title page, item [54] and column 1, line 4, "WINDING" should be --WINDINGS--.

Signed and Sealed this

Seventh Day of July, 1998

Attest:

BRUCE LEHMAN

Attesting Officer

Commissioner of Patents and Trademarks